US011300610B1

(12) United States Patent
Tang

(10) Patent No.: US 11,300,610 B1
(45) Date of Patent: Apr. 12, 2022

(54) INTEGRATED CIRCUIT, CRACK STATUS DETECTOR AND CRACK STATUS DETECTION METHOD

(71) Applicant: Winbond Electronics Corp., Taichung (TW)

(72) Inventor: Chih-Tung Tang, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 17/138,802

(22) Filed: Dec. 30, 2020

(51) Int. Cl.
*G01R 31/28* (2006.01)

(52) U.S. Cl.
CPC ....... *G01R 31/2896* (2013.01); *G01R 31/286* (2013.01); *G01R 31/2879* (2013.01)

(58) Field of Classification Search
CPC ................ G01R 33/0047; H01L 33/48; H01L 2933/0033
See application file for complete search history.

(56) References Cited

U.S. PATENT DOCUMENTS

| 6,455,910 | B1 | 9/2002 | Wang |
| 8,004,066 | B2 | 8/2011 | Kim et al. |
| 8,211,718 | B2 | 7/2012 | Kumagai |
| 8,729,664 | B2 | 5/2014 | Gambino et al. |
| 8,957,496 | B2 * | 2/2015 | Li ....................... H01L 23/5227 257/500 |
| 10,663,513 | B2 * | 5/2020 | Werhane ............... H01J 37/266 |
| 2002/0167071 | A1 | 11/2002 | Wang |
| 2015/0035112 | A1 | 2/2015 | Barry et al. |
| 2019/0011496 | A1 | 1/2019 | Van Gemert et al. |
| 2019/0271739 | A1 | 9/2019 | Werhane et al. |
| 2020/0150174 | A1 | 5/2020 | Kumar et al. |

FOREIGN PATENT DOCUMENTS

| TW | 201935019 | 9/2019 |
| TW | 201937657 | 9/2019 |

OTHER PUBLICATIONS

Office Action of Taiwan Counterpart Application, dated Feb. 26, 2021, pp. 1-9.

* cited by examiner

*Primary Examiner* — Tung X Nguyen
(74) *Attorney, Agent, or Firm* — JCIPRNET

(57) ABSTRACT

An integrated circuit, a crack status detector and a crack status detection method are provided. The crack status detector includes a detection ring, multiple switches, and a current measuring circuit. The detection ring is formed by multiple conductive wire segments coupled in series. The detection ring is disposed adjacent to a side of at least one guard ring in the integrated circuit. The detection ring has a first endpoint and a second endpoint to respectively receive a first reference voltage and a second reference voltage. Each of the switches is disposed between two adjacent conductive wire segments. The switches are respectively turned on or cut off according to multiple control signals. The current measuring circuit transmits the control signals and measures a current on the detection ring according to a turned-on or cut-off status of each of the switches, so as to detect a crack status of the integrated circuit.

20 Claims, 11 Drawing Sheets

INTEGRATED CIRCUIT, CRACK STATUS DETECTOR AND CRACK STATUS DETECTION METHOD

BACKGROUND

Technical Field

The disclosure relates to a crack status detector of an integrated circuit and a crack status detection method, and in particular to a crack status detector of an integrated circuit capable of detecting a short or open status of the integrated circuit and a crack status detection method.

Description of Related Art

As the development of integrated circuits moves towards becoming lighter, thinner and shorter, it also has an impact on the packaging and testing at the backend of the integrated circuits. A thinner and more complex packaging process is likely to result in generation of small cracks in the integrated circuit, and the cracks have to enable a larger change in impedance (for example, resulting in an open circuit) to be more easily detected. These integrated circuits with micro cracks often only fail after a long period of usage, which then results in customer complaints. Therefore, if an effective mechanism can be provided to detect the failure due to the crack status, it can be used to evaluate and improve parameters of the manufacturing process and reduce the probability of the micro cracks occurring in the integrated circuit.

SUMMARY

The disclosure provides an integrated circuit, a crack status detector, and a crack status detection method, which can effectively detect a short-circuit status or an open-circuit status of the integrated circuit due to a crack status.

The crack status detector of the disclosure includes a detection ring, multiple switches, and a current measuring circuit. The detection ring is formed by multiple conductive wire segments coupled in series. The detection ring is disposed adjacent to a side of at least one guard ring of the integrated circuit. The detection ring has a first endpoint and a second endpoint to respectively receive a first reference voltage and a second reference voltage. Each of the switches is disposed between two adjacent conductive wire segments. The switches are respectively turned on or cut off according to multiple control signals. The current measuring circuit transmits the control signals to measure a current on the detection ring according to a turned-on or cut-off status of each of the switches, so as to detect the crack status of the integrated circuit.

The integrated circuit of the disclosure includes at least one guard ring and the crack status detector. The guard ring surrounds the periphery of the integrated circuit. The crack status detector is disposed adjacent to the guard ring.

The detection method of the crack status of the disclosure is suitable for an integrated circuit. The integrated circuit has at least one guard ring surrounding the periphery of the integrated circuit. The detection method of the crack status includes the following steps. A detection ring is disposed adjacent to the guard ring, in which the detection ring is formed by multiple conductive wire segments coupled in series. Multiple switches are disposed on the detection ring, in which each of the switches is disposed between two adjacent conductive wire segments. Multiple control signals are transmitted to respectively control a turned-on or a cut-off status of the multiple switches. And, a current on the detection ring is measured, so as to detect the crack status of the integrated circuit.

Based on the above, the crack status detector of the disclosure can automatically detect an open-circuit or a short-circuit of the integrated circuit due to the crack status, and can effectively detect a position of the short circuit of the integrated circuit due to the crack status, therefore helping to locate the position of a leakage current during a failure analysis of the integrated circuit.

DESCRIPTION OF THE EMBODIMENTS

Figure 1:
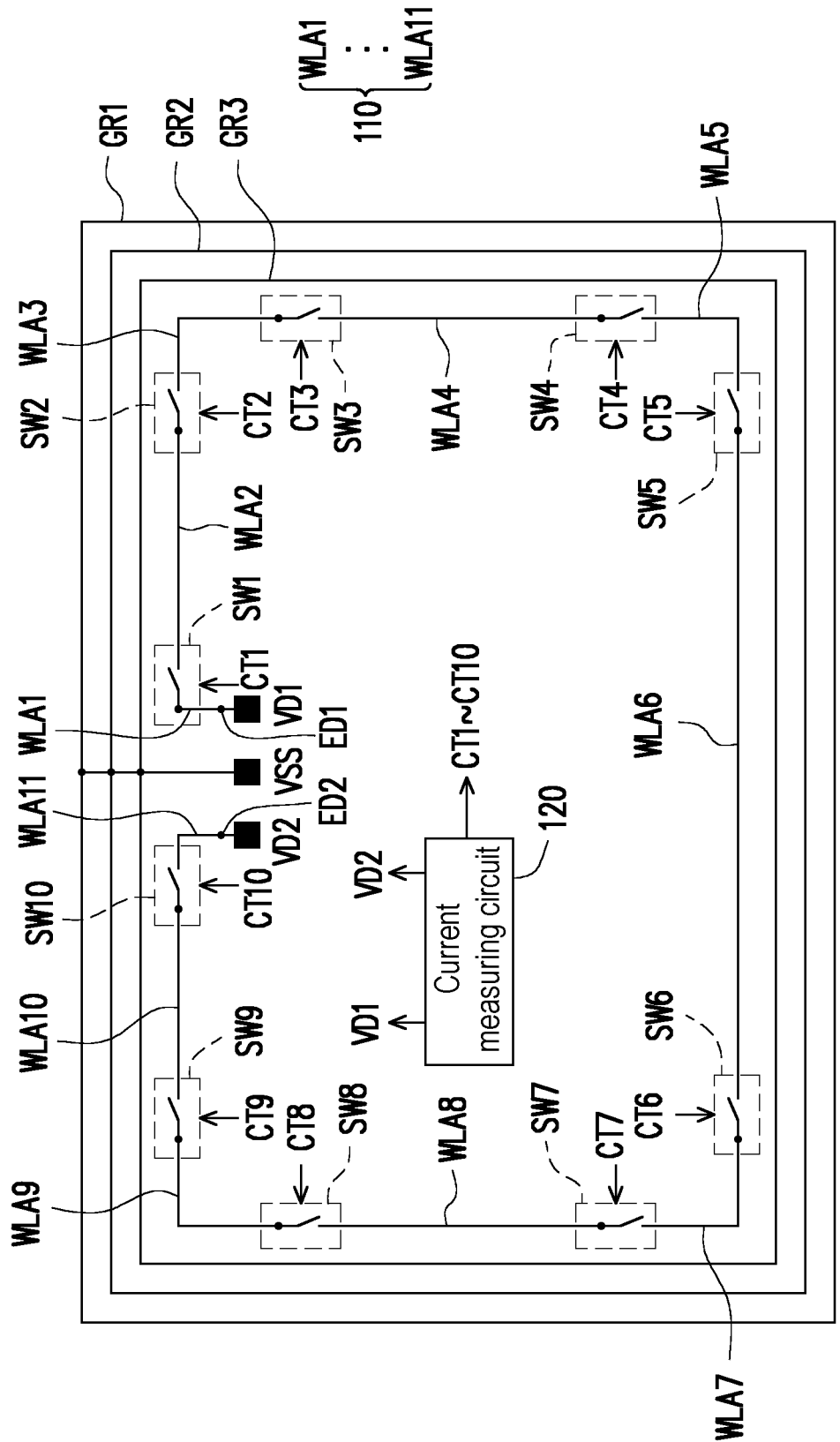
FIG. 1 is a schematic diagram of a crack status detector according to an embodiment of the disclosure.

With reference to FIG. 1, FIG. 1 is a schematic diagram of a crack status detector according to an embodiment of the disclosure. A crack status detector 100 includes a detection ring 110, switches SW1 to SW10, and a current measuring circuit 120. The detection ring 110 includes multiple conductive wire segments WLA1 to WLA11 sequentially coupled to each other in series. The switches SW1 to SW10 are sequentially disposed in the detection ring 110. Each of the switches SW1 to SW10 is disposed between two adjacent conductive wire segments WLA1 to WLA11. In detail, in the embodiment, the switch SW1 is disposed between the adjacent conductive wire segments WLA1 and WLA2, and the switch SW2 is disposed between the adjacent conductive wire segments WLA2 and WLA3, and so on. Therefore, the respective disposition positions of the switches SW1 to SW10 may be known.

The switches SW1 to SW10 respectively receive control signals CT1 to CT10, and are respectively turned on or cut off according to the control signals CT1 to CT10.

In addition, the detection ring 110 also has a first endpoint ED1 and a second endpoint ED2. The conductive wire segments WLA1 to WLA11 are sequentially arranged between the first endpoint ED1 and the second endpoint ED2. The first endpoint ED1 is configured to receive a first reference voltage VD1, and the second endpoint ED2 may be configured to receive a second reference voltage VD2. In addition, the detection ring 110 may be disposed on a side of guard rings GR1 to GR3. Incidentally, there is no limitation to the number of the guard rings GR1 to GR3. In a single integrated circuit, one or more guard rings are often disposed around the periphery of the integrated circuit. The detection ring 110 of the embodiment of the disclosure may be disposed on an inner side of the innermost guard ring GR3 of the integrated circuit, as shown in FIG. 1. Alternatively, the detection ring 110 can also be disposed between any two of the guard rings GR1 to GR3, and is not limited thereto. In the embodiment, the guard rings GR1 to GR3 receive a reference voltage VSS.

The current measuring circuit 120 is coupled to the switches SW1 to SW11, and is coupled to the first endpoint ED1 and the second endpoint ED2 of the detection ring 110. The current measuring circuit 120 is configured to provide the first reference voltage VD1 to the first endpoint ED1 and to provide the second reference voltage VD2 to the second endpoint ED2. In addition, the current measuring circuit 120 generates the control signals CT1 to CT10 to respectively control a turn-on or cut-off status of the switches SW1 to SW10. Each of the switches SW1-SW10 may be independently controlled.

The current measuring circuit 120 is configured to measure a current on the detection ring 110 according to the turned-on or cut-off status of each of the switches SW1 to SW10, so as to detect a crack status of the integrated circuit where the crack status detector 100 is located.

Figure 2A:
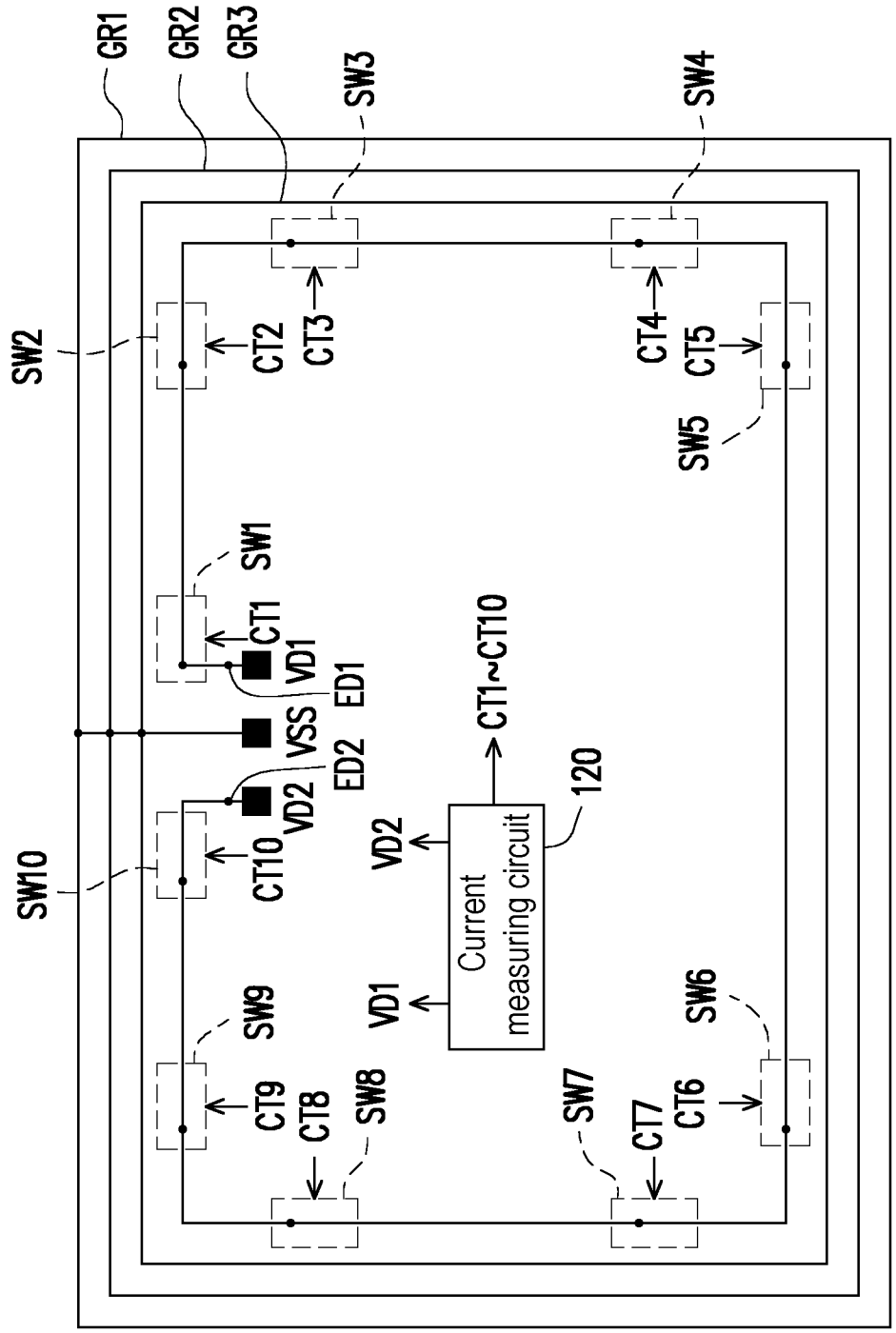
FIGS. 2A to 2F are schematic diagrams of multiple implementations of a short-circuit status test according to an embodiment of the disclosure.

In the embodiment, a detection of the crack status of the integrated circuit may include a short-circuit status test and an open-circuit status test. With reference to FIGS. 2A to 2F, FIGS. 2A to 2F are schematic diagrams of multiple implementations of the short-circuit status test according to an embodiment of the disclosure. In FIG. 2A, based on the hardware architecture shown in FIG. 1, when the crack status detector 100 performs the short-circuit status test, the current measuring circuit 120 transmits the control signals CT1 to CT10 to enable the switches SW1 to SW10 to all be turned on. In addition, the current measuring circuit 120 sends the first reference voltage VD1 and the second reference voltage VD2 of a same voltage value respectively to the first endpoint ED1 and the second endpoint ED2 of the detection ring 110. Furthermore, voltage values of the first reference voltage VD1 and the second reference voltage VD2 are different from a voltage value of the reference voltage VS S received by the guard rings GR1 to GR3. For example, the reference voltage VSS received by the guard rings GR1 to GR3 may be a ground voltage, while the voltage values of the first reference voltage VD1 and the second reference voltage VD2 may be any voltage value greater than the voltage value of the ground voltage.

Based on an ideal status, the two endpoints (the first endpoint ED1 and the second endpoint ED2) of the detection ring 110 and the guard rings GR1 to GR3 are isolated from each other. Therefore, in an ideal status, a current measured by the current measuring circuit 120 between the first endpoint ED1 or the second endpoint ED2 on the detection ring 110 and any one of the guard rings GR1 to GR3 should approach zero. However, in practical applications, the integrated circuit may crack, which then enable the generation of a short circuit between at least one of the guard rings GR1 to GR3 and the detection ring 110. This short circuit will enable the first endpoint ED1 and/or the second endpoint ED2 of the detection ring 110 and at least one of the guard rings GR1 to GR3 to generate a loop and in turn, generate a current. Therefore, when the current measuring circuit 120 detects that the current on the detection ring 110 is greater than a preset critical value, it can determine that a crack status has occurred in the integrated circuit and a short circuit is generated.

The critical value may be used to eliminate a misjudgment by the current measuring circuit 120 on the short-circuit status due to a current measurement error. The size of the critical value may be set by the designer without any limitation.

Incidentally, in order to prevent the detection ring 110 from generating excessive current due to the short circuit, a resistor with an appropriate resistance may be coupled in series between the first endpoint ED1 and the second endpoint ED2 of the detection ring 110.

When the current measuring circuit 120 detects the short circuit occurring between the detection ring 110 and the guard rings GR1 to GR3, it may further perform detection of the position of the short circuit. Here, the current measuring circuit 120 may further enable the switches SW1 to SW10 to be cut off one by one according to the sequential arrangement of the switches SW1 to SW10, such as according to a first sequence (from the switch SW1 to the switch SW10) or a second sequence (from the switch SW10 to the switch SW1), before measuring the current on the detection ring 110. Then, the position of the short circuit between the detection ring 110 and the guard rings GR1 to GR3 is determined according to the measured current on the detection ring 110. The first sequence is opposite to the second sequence.

Figure 2B:
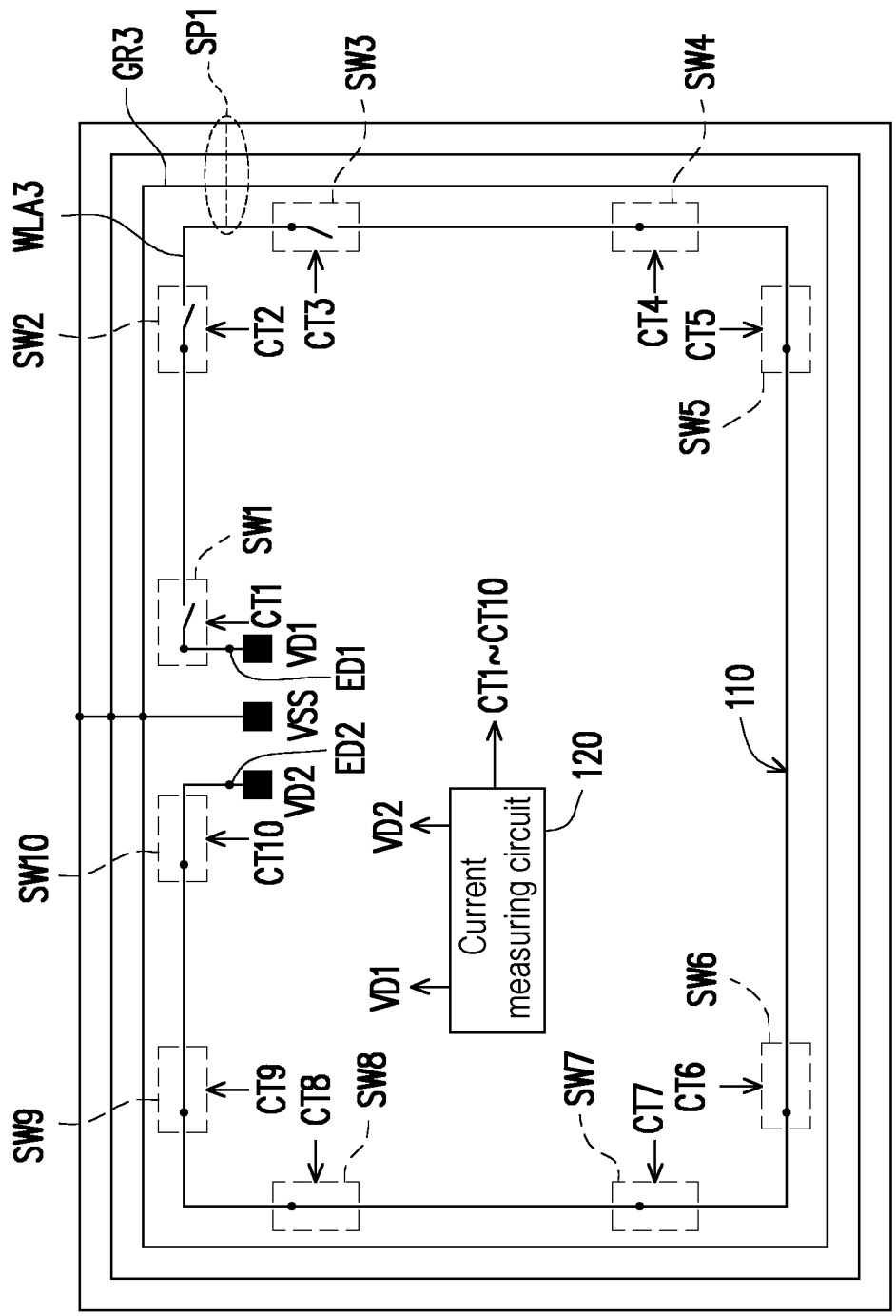

With reference to FIG. 2B, a short-circuit path SP1 is generated between the guard rings GR1 to GR3 and the conductive wire segment WLA3 on the detection ring 110. In the embodiment, in the first step, the switch SW1 may be first cut off while the switches SW2 to SW10 are kept turned on according to the first sequence (from the switch SW1 to the switch SW10). At this time, the guard rings GR1 to GR3 generate a loop with the second endpoint ED2 through the short-circuit path SP1, which enables the current between the second endpoint ED2 of the detection ring 110 and the reference voltage VSS measured by the current measuring circuit 120 to be greater than the critical value. Therefore, the short-circuit position test has to continue. Then, in the second step, the switches SW1 and SW2 are both further enabled to be cut off, while the remaining switches SW3 to SW10 are kept turned on. The guard rings GR1 to GR3 may still generate the loop with the second endpoint ED2 through the short-circuit path SP1, which enables the current measured by the current measuring circuit 120 to be greater than the critical value. Therefore, the short-circuit position test action has to continue. Subsequently, in the third step, the switches SW1 to SW3 are all cut off. It is worth noting that at this time, the connection between the short-circuit path SP1 and the detection ring 110 is cut off, and the remaining switches SW4 to SW10 are kept turned on. Therefore, the current of the detection ring 110 measured by the current measuring circuit 120 may be less than the critical value. Based on this, it may be determined that the short-circuit path SP1 is on the conductive wire segment WLA3 between the switches SW3 and SW2 on the detection ring 110, and the position where the short-circuit status occurs on the detection ring 110 may be obtained.

Figure 2C:
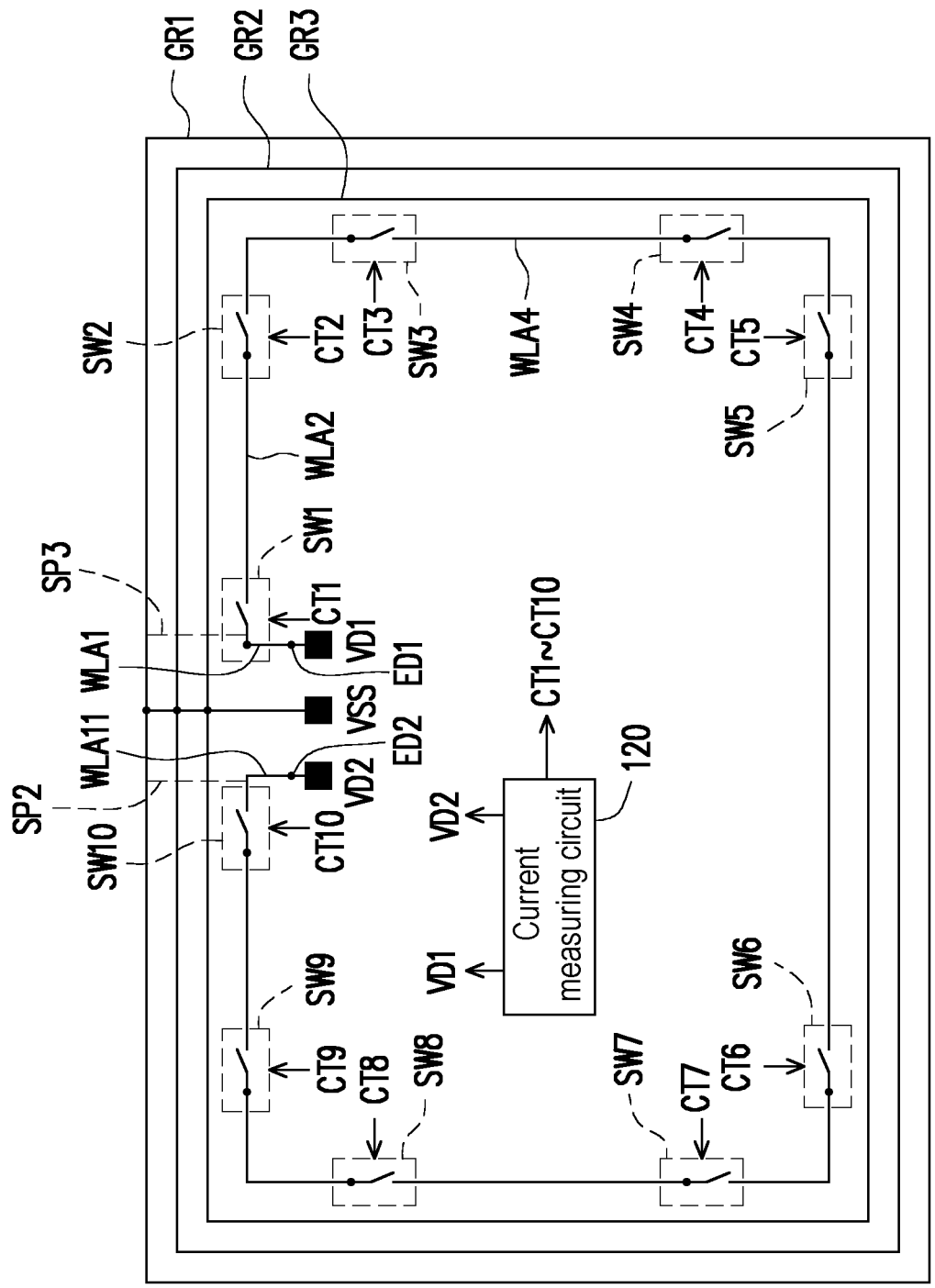

In FIG. 2C, if all the switches SW1 to SW10 are cut off and the current measured by the current measuring circuit 120 on the detection ring 110 is still greater than the critical value, then it indicates that a short-circuit path SP3 occurs between the guard rings GR1 to GR3 and the conductive wire segment WLA1, and/or a short-circuit path SP2 occurs between the guard rings GR1 to GR3 and the conductive wire segment WLA11. Therefore, the position where the short-circuit status occurs on the detection ring 110 may still be determined.

Figure 2D:
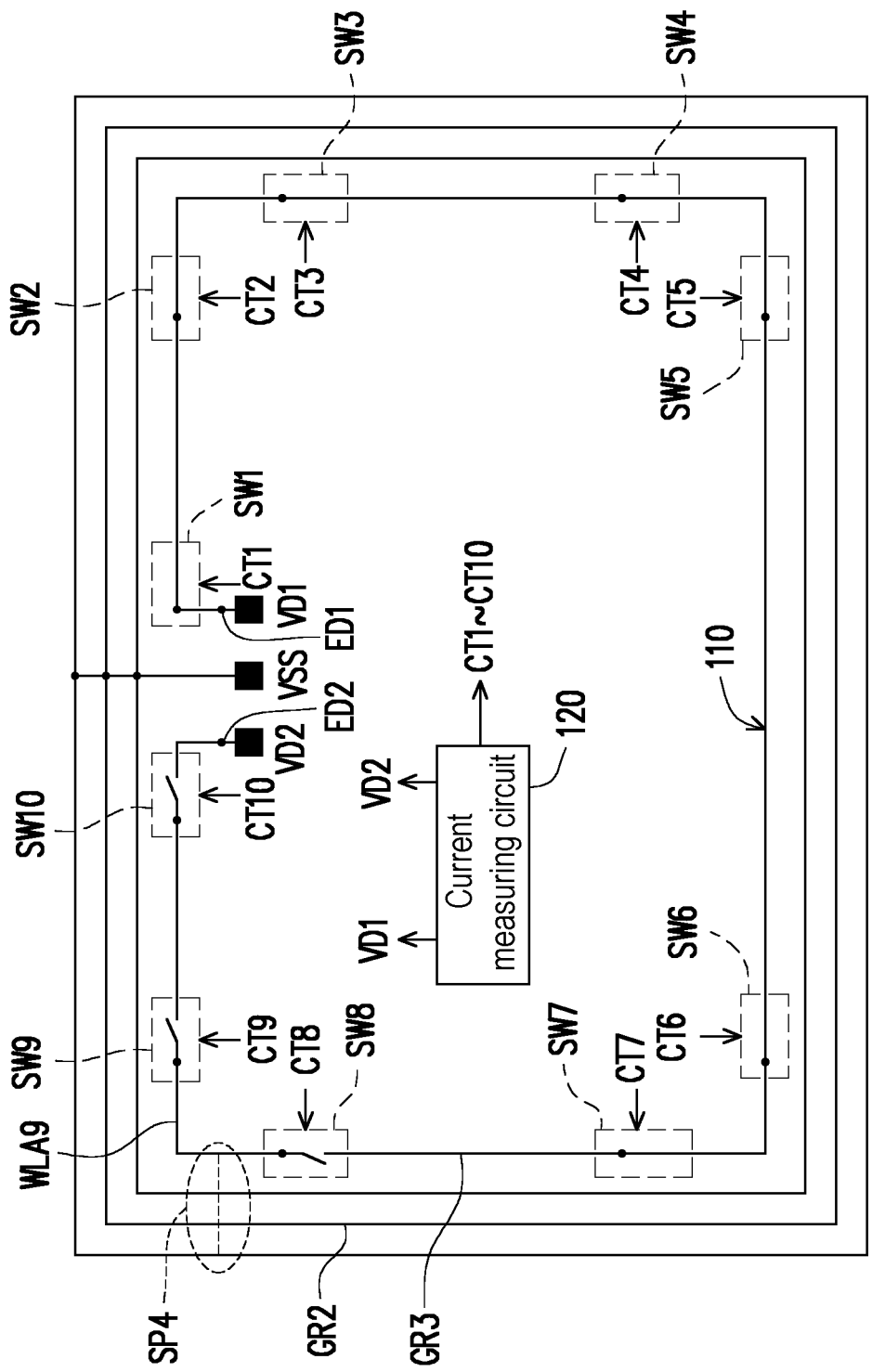

In addition, in FIG. 2D, a short-circuit path SP4 is generated between the guard rings GR1 to GR3 and the conductive wire segment WLA9 of the detection ring 110. In the embodiment, in the first step, the switch SW10 is first cut off while the switches SW9 to SW1 are kept turned on according to the second sequence (from the switch SW10 to the switch SW1). At this time, the guard rings GR1 to GR3 generate a loop with the first endpoint ED1 through the short-circuit path SP4, which enables the current between the first endpoint ED1 of the detection ring 110 and the reference voltage VSS measured by the current measuring circuit 120 to be greater than the critical value. Therefore, the short-circuit position test has to continue. Then, in the second step, the switches SW10 and SW9 are both further enabled to be cut off, while the remaining switches SW8 to SW1 are kept turned on. The guard rings GR1 to GR3 may still generate the loop with the first endpoint ED1 through the short-circuit path SP4, which enables the current measured by the current measuring circuit 120 to be greater than the critical value. Therefore, the short-circuit position test action has to continue. Subsequently, in the third step, the switches SW10 to SW8 are all cut off while the remaining switches SW7 to SW1 are kept turned on. It is worth noting that at this time, the connection between the short-circuit path SP4 and the detection ring 110 is cut off. Therefore, the current of the detection ring 110 measured by the current measuring circuit 120 may be less than the critical value. Based on this, it may be determined that the short-circuit path SP4 is on the conductive wire segment WLA9 between the switches SW8 and SW9 on the detection ring 110, and the position where the short-circuit status occurs on the detection ring 110 may be obtained.

As in the embodiment of FIG. 2C, in the process of testing according to the second sequence, if all the switches SW10 to SW1 are cut off, and the current measured by the current measuring circuit 120 on the detection ring 110 is still greater than the critical value, then it indicates that a short-circuit path is generated on the conductive wire segment WLA1 and/or WLA11.

Figure 2E:
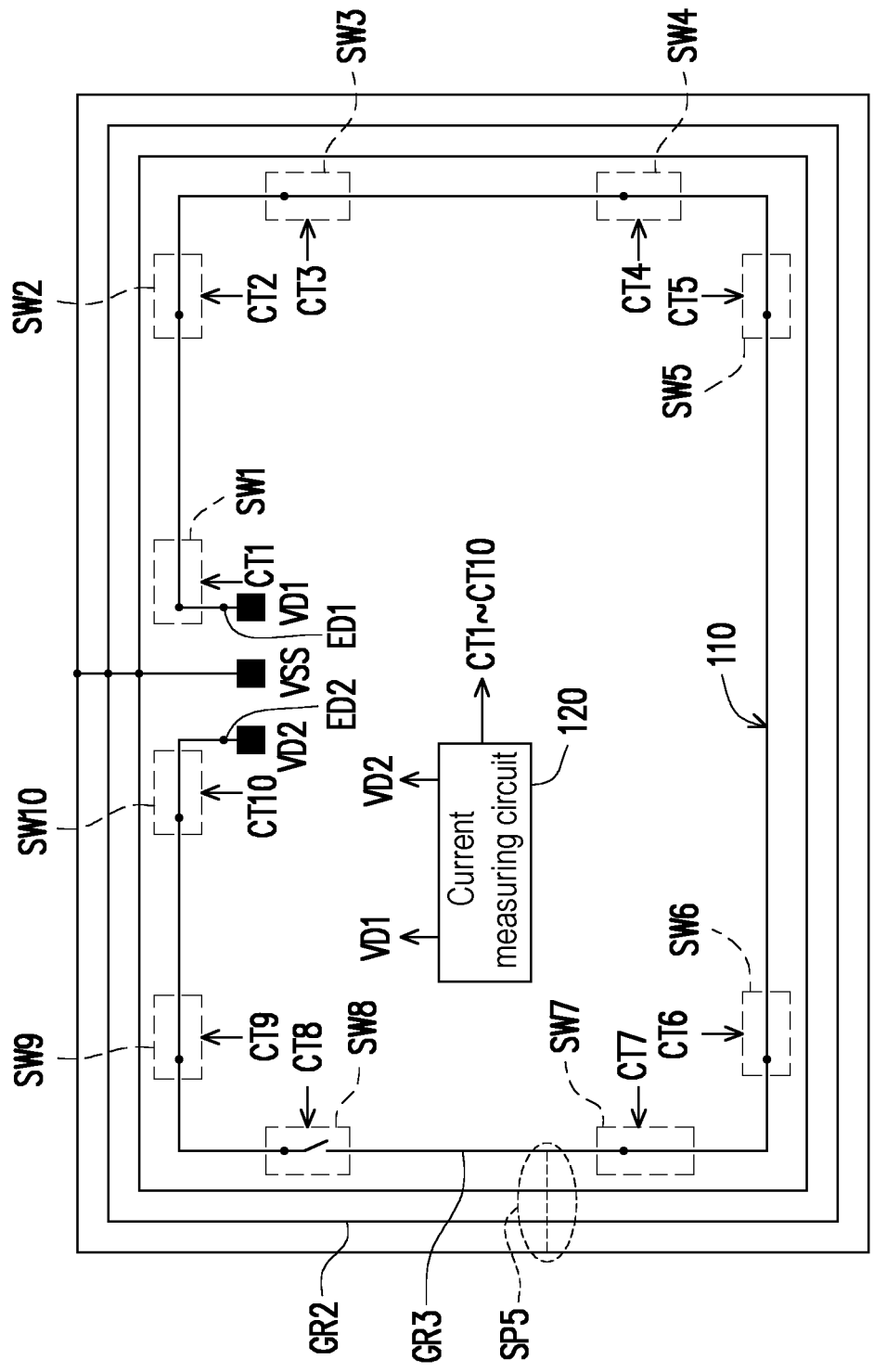

In the embodiment of FIG. 2E, the current measuring circuit 120 can generate the first reference voltage VD1 and the second reference voltage VD2 to be of different voltages, and respectively provide the first reference voltage VD1 and the second reference voltage VD2 to the first endpoint ED1 and the second endpoint ED2 of the detection ring 110. When the first reference voltage VD1 is greater than the second reference voltage VD2, the second reference voltage VD2 may be equal to the reference voltage VSS received by the guard rings GR1 to GR3. In contrast, when the first reference voltage VD1 is less than the second reference voltage VD2, the first reference voltage VD1 may be equal to the reference voltage VSS received by the guard rings GR1 to GR3.

Taking the first reference voltage VD1 and the reference voltage VSS as an example, when the switches SW1 to SW10 are all turned on, a current between the second endpoint ED2 and the reference voltage VSS measured by the current measuring circuit 120 may be greater than the critical value. Then, a switch is sequentially cut off according to the first sequence (from the switch SW1 to the switch SW10). For example, in a first stage, the switch SW1 is cut off (the switches SW2-SW10 remain turned on). Based on FIG. 2E, there is a short-circuit path SP5 between the guard rings GR1 to GR3 and the detection ring 110. Therefore, the current between the second endpoint ED2 and the reference voltage VSS measured by the current measuring circuit 120 remains greater than the critical value, indicating that the short-circuit position test has to continue. In a second stage, the switch SW2 is cut off, while the switches SW3 to SW10 remain turned on. At this time, the second endpoint ED2 of the detection ring 110 may still be connected to the reference voltage VSS through the short-circuit path SP5, so the current measured by the current measuring circuit 120 remains greater than the critical value.

Please note that in the second stage, the switch SW1 may either be cut off or turned on, with no limitation.

In continuation of the above method, the switches SW3 to SW8 are enabled to be respectively cut off sequentially in multiple stages. When the switch SW8 is cut off, a connection path between the short-circuit path SP5 and the second endpoint ED2 of the detection ring 110 is cut off. Therefore, the current measured by the current measuring circuit 120 may be less than the critical value. Based on this, the short-circuit path SP5 occurring on the conductive wire segment between the switches SW7 and SW8 may be known. In addition, when the current measured by the current measuring circuit 120 is less than the critical value, the short-circuit status position test may be stopped.

Incidentally, if the current measured by the current measuring circuit 120 is still greater than the critical value after the switch SW10 is cut off, it indicates that the short-circuit path occurs between the switch SW10 and the second endpoint ED2.

Figure 2F:
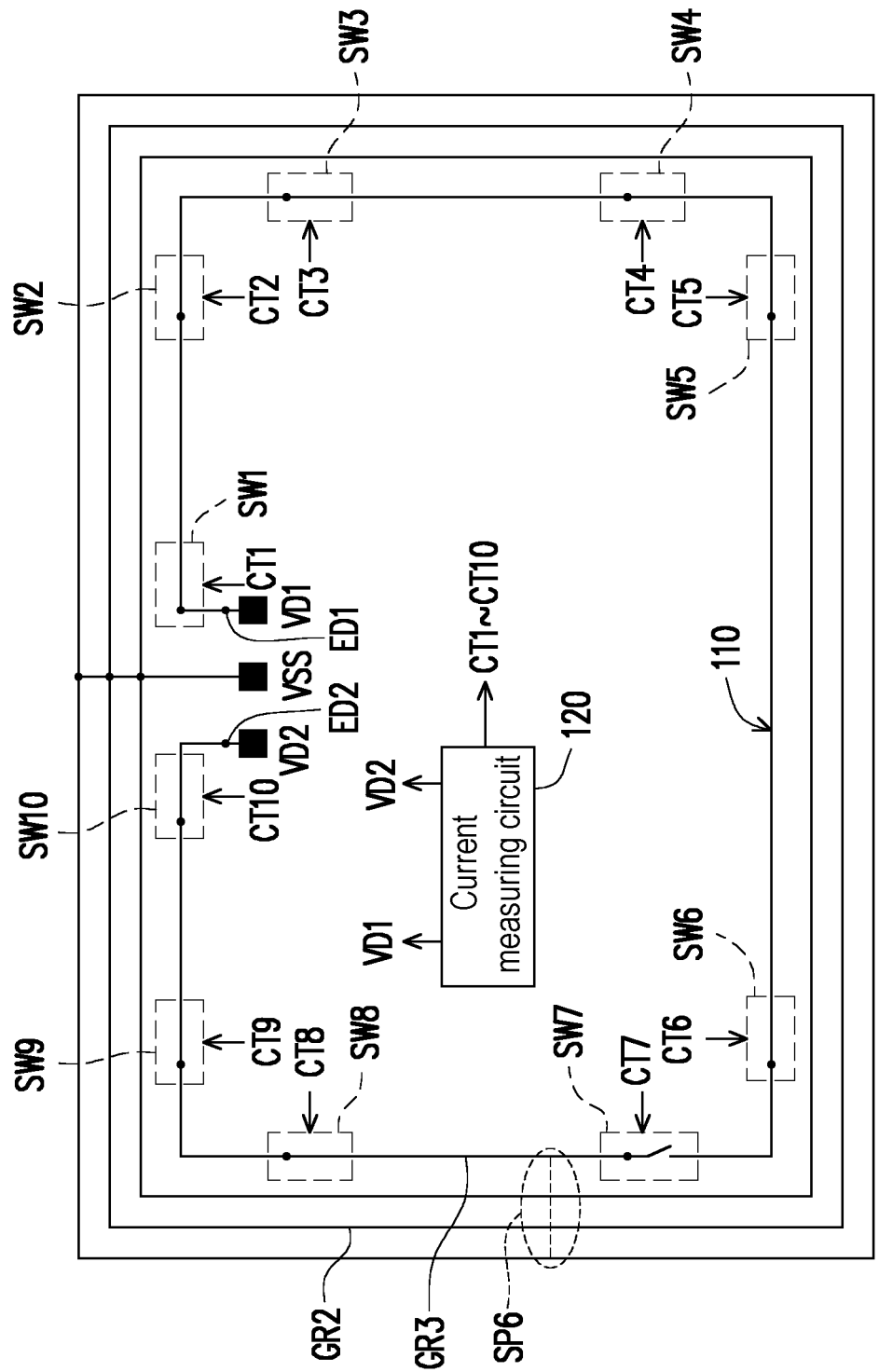

In the embodiment of FIG. 2F, as an example, the second reference voltage VD2 and the reference voltage VSS are the same. When the switches SW1 to SW10 are all turned on, the current between the first endpoint and the reference voltage VSS measured by the current measuring circuit 120 may be greater than the critical value. Then, a switch is cut off sequentially according to the second sequence (from the switch SW10 to the switch SW1). For example, in the first stage, the switch SW10 is cut off (the switches SW9 to SW1 remain turned on). Based on FIG. 2F, there is a short-circuit path SP6 between the guard rings GR1 to GR3 and the detection ring 110. Therefore, measuring the current between the first endpoint ED1 and the reference voltage VSS measured by the current measuring circuit 120 remains greater than the critical value, indicating that the short-circuit position test has to continue. In the second stage, the switch SW9 is cut off, and the switches SW8 to SW1 remain turned on. At this time, the first endpoint ED1 of the detection ring 110 may still be connected to the reference voltage VSS through the short-circuit path SP6, so the current measured by the current measuring circuit 120 remains greater than the critical value.

Please note that in the second stage, the switch SW10 may either be cut off or turned on, with no limitation.

In continuation of the above method, the switches SW8 and SW7 are respectively enabled to be cut off sequentially in multiple stages. In FIG. 2F, when the switch SW7 is cut off, a connection path between the short-circuit path SP6 and the first endpoint ED1 of the detection ring 110 is cut off. Therefore, the current measured by the current measuring circuit 120 may be less than the critical value. Based on this, the short-circuit path SP6 occurring on the conductive wire segment between the switches SW7 and SW8 may be known. In addition, when the current measured by the current measuring circuit 120 is less than the critical value, the short-circuit status position test may be stopped.

Incidentally, if the current measured by the current measuring circuit 120 is still greater than the critical value after the switch SW1 is cut off, it indicates that the short-circuit path occurs between the switch SW1 and the first endpoint ED1.

On the other hand, with reference to FIG. 1 again, during the open-circuit status test of the integrated circuit, the current measuring circuit 120 may enable the first reference voltage VD1 and the second reference voltage VD2 to be different, and provide the control signals CT1 to CT10 to enable the switches SW1 to SW10 to all be turned on. Theoretically, based on a voltage difference (a difference between the first reference voltage VD1 and the second reference voltage VD2) between the first endpoint ED1 and the second endpoint ED2 of the detection ring 110, the current measuring circuit 120 should be able to measure a certain amount of current on the detection ring 110. Therefore, if the current measuring circuit 120 detects that the current on the detection ring 110 is less than the critical value, it indicates that the open-circuit status is generated in at least a part of the detection ring 110 due to the crack status of the integrated circuit, and the open-circuit status test may be completed.

It is worth noting that the open-circuit status test may be performed before the short-circuit status test, and the short-circuit status test is performed after the open-circuit status test confirms that the detection ring 110 does not has an open-circuit status.

Figure 3:
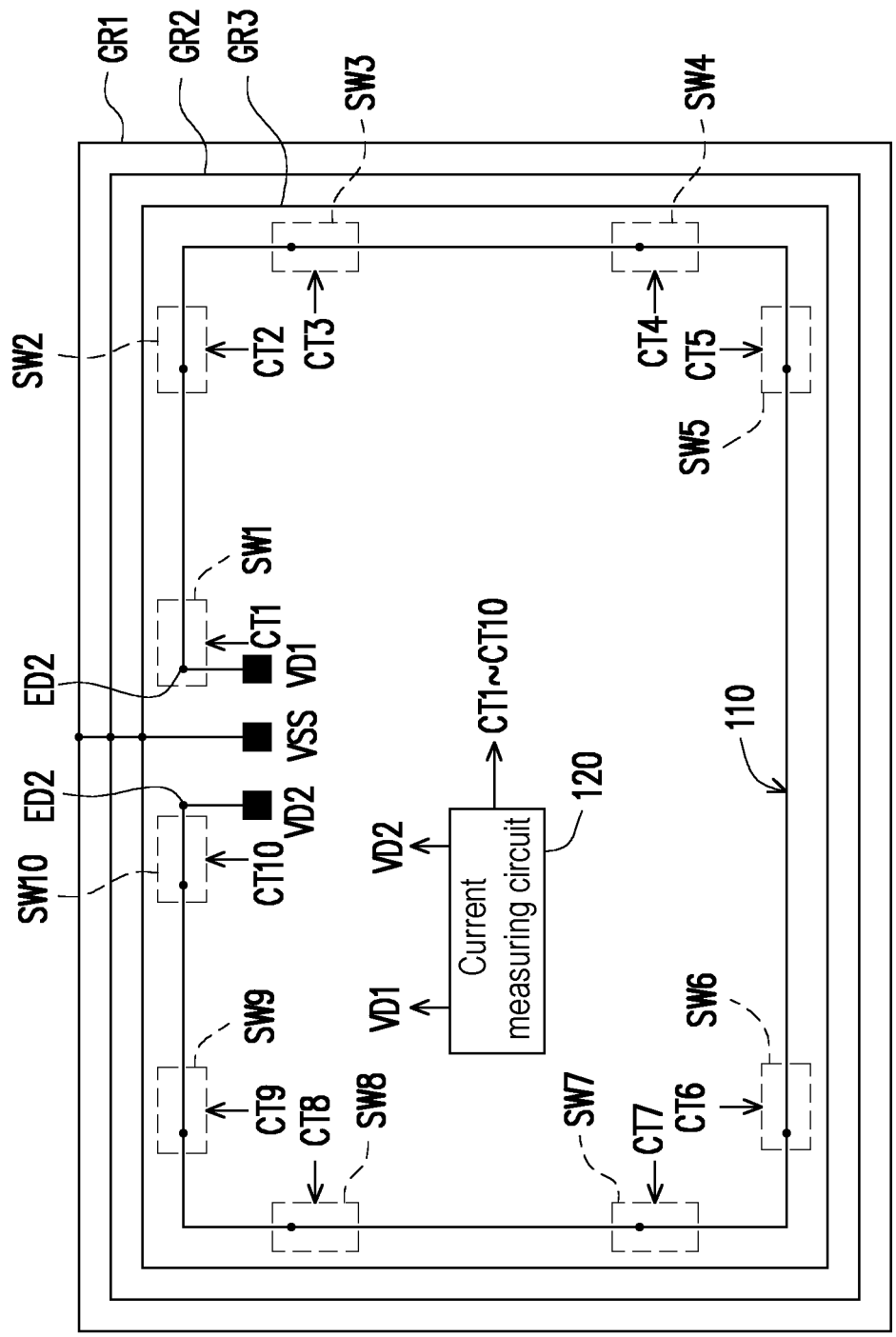
FIG. 3 is a schematic diagram of an open-circuit status test according to an embodiment of the disclosure.

With reference to FIG. 3, FIG. 3 is a schematic diagram of an open-circuit status test according to an embodiment of the disclosure. In FIG. 3, based on the hardware architecture shown in FIG. 1, in the open-circuit status test, the current measuring circuit 120 transmits the control signals CT1 to CT10 to enable the switches SW1 to SW10 to all be turned on. The current measuring circuit 120 also provides the first reference voltage VD1 and the second reference voltage VD2 of different voltages respectively to the first endpoint ED1 and the second endpoint ED2 of the detection ring 110.

In a normal status, based on the difference between the first reference voltage VD1 and the second reference voltage VD2, the loop formed between the first endpoint ED1 and the second endpoint ED2 of the detection ring 110 should have a certain current. Therefore, if the current measuring circuit 120 detects that the current on the detection ring 110 is less than a preset critical value, it indicates that an open-circuit status may have been generated in the detection ring 110 due to the crack status of the integrated circuit.

The critical value may be set according to the voltage difference between the first reference voltage VD1 and the second reference voltage VD2, and the equivalent resistance value of the detection ring 110, but is not limited thereto.

Figure 4:
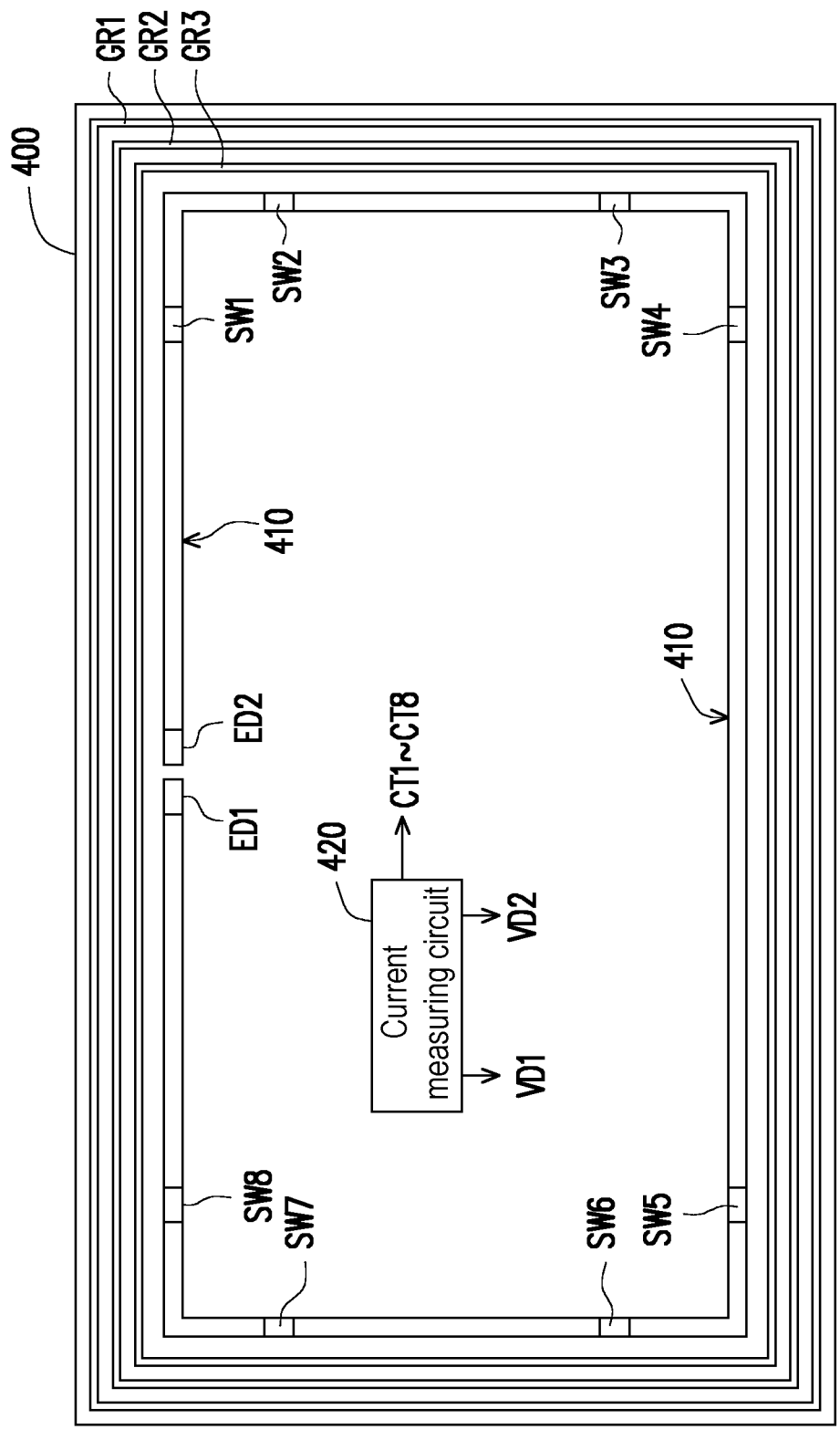
FIG. 4 is a schematic diagram of an integrated circuit according to an embodiment of the disclosure.

With reference to FIG. 4, FIG. 4 is a schematic diagram of an integrated circuit according to an embodiment of the disclosure. An integrated circuit 400 includes the guard rings GR1 to GR3, a detection ring 410, a current measuring circuit 420, and the switches SW1 to SW8. The detection ring 410, the current measuring circuit 420, and the switches SW1 to SW8 form the crack status detector. The detection ring 410 has the first endpoint ED1 and the second endpoint ED2. The switches SW1 to SW8 are sequentially arranged between the first endpoint ED1 and the second endpoint ED2, and are respectively turned on or cut off according to the control signals CT1 to CT8 generated by the current measuring circuit 420. The current measuring circuit 420 also respectively provides the first reference voltage VD1 and the second reference voltage VD2 to the first endpoint ED1 and the second endpoint ED2.

The guard rings GR1 to GR3 are disposed on the periphery of the integrated circuit 400 and surround the integrated circuit 400. The detection ring 410 may be disposed on the side of the guard rings GR1 to GR3. In the embodiment, the detection ring 410 is disposed on the inner side of the innermost guard ring GR3. In other embodiments of the disclosure, the detection ring 410 may also be disposed between two of the guard rings GR1 to GR3. The material used to construct the detection ring 410 may be the same as the material used to construct the guard rings GR1 to GR3, but is not limited thereto. The detection ring 410 and the guard rings GR1 to GR3 may be disposed in a manner familiar to a person skilled in the art, but is not limited thereto. In the embodiment, the reference voltage VSS received by the guard rings GR1 to GR3 may be the ground voltage in the integrated circuit 400.

The switches SW1 to SW8 may be constructed by semiconductor devices familiar to a person skilled in the art, such as a transistor.

During a detection of a crack status of the integrated circuit 400, the current measuring circuit 420 may provide the first reference voltage VD1 and the second reference voltage VD2 of the same voltage or different voltages respectively to the first endpoint ED1 and the second endpoint ED2. Reference may be made to the foregoing implementations in FIGS. 2A to 3 for the details of the detection of the crack status, which will not be reiterated here.

The current measuring circuit 420 may have a voltage supply circuit and a control signal generation circuit. The voltage supply circuit may provide the first reference voltage VD1 and the second reference voltage VD2 of the same voltage or different voltages according to different tests. The control signal generating circuit may be a digital circuit, which initiates the short-circuit status test or the open-circuit status test after receiving a command, and thereby generating the control signals CT1 to CT8. The integrated circuit 400 may receive a signal provided by an external device to generate the command.

From the above description, it is shown that the integrated circuit 400 of the disclosure may perform detection of the crack status of the integrated circuit 400 at any required time. In other words, the integrated circuit 400 of the embodiment of the disclosure may perform the detection of the crack status one or more times at any time after completion of a reliability test. It is also possible to perform the detection of the crack status one or more times after long-term usage. Therefore, the crack status of the integrated circuit 400 is effectively monitored at any time and in real time.

It is worth noting that, in the embodiment of the disclosure, there is no limitation on the number of the switches SW1 to SW8 and their disposition positions on the detection ring 410. The designer may decide on the number of the switches SW1to SW8 and the position of each of the switches SW1 to SW8 according to the physical structure of the integrated circuit 400 and/or requirements of the detection resolution, with no limitation.

Figure 5:
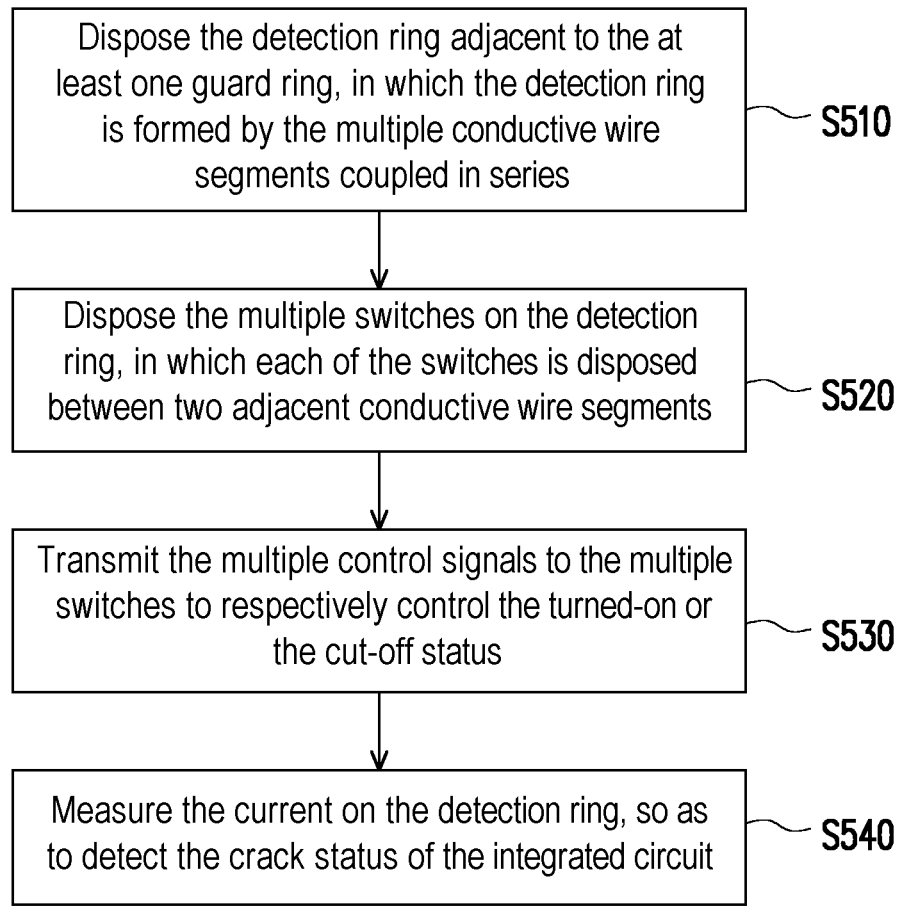
FIG. 5 shows a flowchart of a detection method of a crack status according to an embodiment of the disclosure.

With reference to FIG. 5, FIG. 5 shows a flowchart of a detection method of a crack status according to an embodiment of the disclosure. The detection process in FIG. 5 is applicable to the integrated circuit. The integrated circuit has the at least one guard ring surrounding the periphery of the integrated circuit. In Step S510, the detection ring is disposed adjacent to the at least one guard ring, in which the detection ring is formed by the multiple conductive wire segments coupled in series. In Step S520, the multiple switches are disposed on the detection ring, in which each of the switches is disposed between two adjacent conductive wire segments. Next, in Step S530, the multiple control signals are transmitted to the multiple switches to respectively control the turned-on or the cut-off status. And, in Step S540, the current on the detection ring is measured, so as to detect the crack status of the integrated circuit.

Reference may be made to the foregoing multiple embodiments and implementations with detailed descriptions for the implementation details of the above step, which will not be reiterated here.

Figure 6:
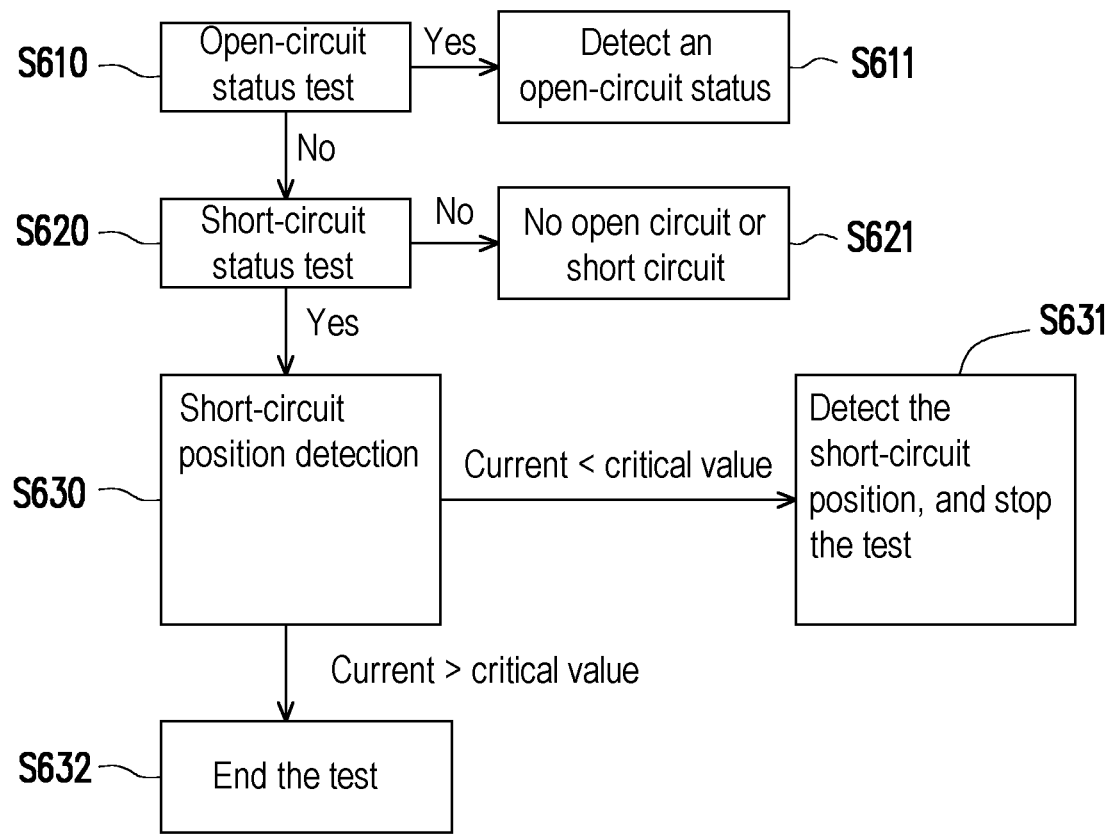
FIG. 6 shows a flowchart of a detection method of a crack status according to another embodiment of the disclosure.

With reference to FIG. 6, FIG. 6 shows a flowchart of a detection method of a crack status according to another embodiment of the disclosure. In Step S610, the open-circuit status test is performed, and the detection (Step S611) of the open circuit status is instructed when the test result indicates that the detection ring has an open-circuit status. The open-circuit status test of the Step S610 may be performed according to the description of the foregoing embodiment in FIG. 3, which will not be reiterated here.

If Step S610 detects that the detection ring does not has an open circuit, Step S620 may then be executed to perform the short-circuit status detection. The short-circuit status test of Step S620 may be performed according to the description of the foregoing embodiment in FIG. 2A, which will not be reiterated here. When the test result of the Step S620 indicates that the detection ring has a short-circuit status, the detection of the short-circuit position of Step S630 may be performed. In contrast, if the test result of the Step S620 indicates that the detection ring does not have a short circuit, the detection ring is instructed to have neither an open circuit nor a short circuit (Step S621).

The Step S630 may be performed through at least one of the implementations of FIGS. 2B to 2F, which will not be reiterated here. When the current of the detection ring is detected to be less than a critical value, the short-circuit position may be detected and the test may be stopped (Step S631). If the Step S630 continues to detect the current of the detection ring to be greater than the critical value, then it may be damaged at the endpoints (the first endpoint and/or the second endpoint), and the test is stopped (Step S632).

In summary, through the disposition of the detection ring and the disposition of the multiple switches in the detection ring, and by providing different or the same reference voltages to the two endpoints of the detection ring, in addition to the turning on or cutting off of the switches, the disclosure may effectively detect the short circuit or the open circuit of the integrated circuit due to the crack. The crack status detector of the embodiment of the disclosure is disposed in the integrated circuit, therefore it may be activated at any time. This helps to locate the position of current leakage in the integrated circuit during a failure analysis, and allows further adjustments to be made to the manufacturing process and manufacturing parameters of the integrated circuit, which can improve the reliability of the integrated circuit.

Although the disclosure has been disclosed with the foregoing exemplary embodiments, they are not intended to limit the disclosure. Any person skilled in the art can make various changes and modifications within the spirit and scope of the disclosure. Accordingly, the scope of the disclosure is defined by the claims appended hereto and their equivalents.

What is claimed is:

1. A crack status detector, suitable for an integrated circuit, comprising:
   a detection ring, formed by a plurality of conductive wire segments coupled in series, wherein the detection ring is disposed adjacent to a side of at least one guard ring in the integrated circuit, and the detection ring has a first endpoint and a second endpoint to respectively receive a first reference voltage and a second reference voltage;
   a plurality of switches, wherein each of the plurality of switches is disposed between two adjacent conductive wire segments, and the plurality of switches are respectively turned on or cut off according to a plurality of control signals; and
   a current measuring circuit, which transmits the plurality of control signals to measure a current on the detection ring according to a turned-on or a cut-off status of the each of the plurality of switches, so as to detect a crack status of the integrated circuit.

2. The crack status detector according to claim 1, wherein in a short-circuit status test, the current measuring circuit enables the first reference voltage and the second reference voltage to be the same, and enables the first reference voltage and a third reference voltage that is received by the at least one guard ring to be different, and the current measuring circuit determines the crack status of the integrated circuit by measuring the current on the detection ring when the plurality of switches are all turned on.

3. The crack status detector according to claim 2, wherein in the short-circuit status test, the current measuring circuit determines that a short circuit occurs between the detection ring and the at least one guard ring when the current on the detection ring is greater than a critical value.

4. The crack status detector according to claim 3, wherein in the short-circuit status test, the current measuring circuit further enables the each of the plurality of switches to be cut off one by one according to a first sequence according to a sequential arrangement of the plurality of switches, and determines a position where the short circuit occurs between the detection ring and the at least one guard ring according to the current on the detection ring when the current on the detection ring is greater than the critical value.

5. The crack status detector according to claim 4, wherein in the short-circuit status test, the current measuring circuit further enables the each of the plurality of switches to be cut off one by one according to a second sequence that is opposite to the first sequence according to the sequential arrangement of the plurality of switches, and determine the position where the short circuit occurs between the detection ring and the at least one guard ring according to the current on the detection ring when the current on the detection ring is greater than the critical value.

6. The crack status detector according to claim 1, wherein in a short-circuit status test, the current measuring circuit enables the first reference voltage and the second reference voltage to be different, the crack status detector enables the plurality of switches to all be turned on during an initial time interval and enables the each of the plurality of switches to be cut off according to a first sequence after the initial time interval, and the current measuring circuit determines the crack status of the integrated circuit according to whether the current on the detection ring is less than a critical value.

7. The crack status detector according to claim 6, wherein in the short-circuit status test, the plurality of switches are all enabled to be turned on during the initial time interval, and the each of the plurality of switches are enabled to be cut off according to a second sequence that is opposite to the first sequence after the initial time interval, and the current measuring circuit determines the crack status of the integrated circuit according to whether the current on the detection ring is less than the critical value.

8. The crack status detector according to claim 1, wherein in an open-circuit status test, the current measuring circuit enables the first reference voltage and the second reference voltage to be different and enables the plurality of switches to all be turned on, and the current measuring circuit determines the crack status of the integrated circuit according to the current on the detection ring.

9. The crack status detector according to claim 8, wherein in the open-circuit status test, the current measuring circuit determines that an open circuit occurs at the detection ring when the current measuring circuit detects the current on the detection ring is less than a critical value.

10. The crack status detector according to claim 8, wherein the open-circuit status test occurs before a short-circuit status test.

11. An integrated circuit, comprising:
   at least one guard ring, surrounding a periphery of the integrated circuit; and
   a crack status detector according to claim 1, disposed in the integrated circuit.

12. A crack status detection method, suitable for an integrated circuit, wherein the integrated circuit has at least one guard ring surrounding a periphery of the integrated circuit, the crack status detection method comprising:
   disposing a detection ring adjacent to the at least one guard ring, wherein the detection ring is formed by a plurality of conductive wire segments coupled in series, wherein the detection ring has a first endpoint and a second endpoint to respectively receive a first reference voltage and a second reference voltage;
   disposing a plurality of switches on the detection ring, wherein each of the plurality of switches is disposed between two adjacent conductive wire segments;
   transmitting a plurality of control signals to respectively control a turn-on or cut-off status of the plurality of switches; and
   measuring a current on the detection ring, so as to detect a crack status of the integrated circuit.

13. The crack status detection method according to claim 12, wherein in a short-circuit status test:
   the first reference voltage and the second reference voltage are enabled to be the same, and the first reference voltage and a third reference voltage that is received by the at least one guard ring are enabled to be different; and
   the current on the detection ring is measured when the plurality of switches are all turned on, so as to determine the crack status of the integrated circuit.

14. The crack status detection method according to claim 13, wherein in the short-circuit status test, a short circuit is determined to occur between the detection ring and the at least one guard ring when the current on the detection ring is greater than a critical value.

15. The crack status detection method according to claim 14, wherein in the short-circuit status test:
   the each of the plurality of switches is cut off one by one according to a first sequence when the current on the detection ring is greater than the critical value; and
   a position where the short circuit occurs between the detection ring and the at least one guard ring is determined according to the current on the detection ring.

16. The crack status detection method according to claim 15, wherein in the short-circuit status test:
   the each of the plurality of switches is cut off one by one according to a second sequence that is opposite to the first sequence when the current on the detection ring is greater than the critical value; and
   the position where the short circuit occurs between the detection ring and the at least one guard ring is determined according to the current on the detection ring.

17. The crack status detection method according to claim 12, wherein in a short-circuit status test:
   the first reference voltage and the second reference voltage are enabled to be different;
   the plurality of switches are enabled to all be turned on in an initial time interval;
   the each of the plurality of switches is enabled to be cut off according to a first sequence after the initial time interval; and
   the crack status of the integrated circuit is determined according to whether the current on the detection ring is less than a critical value.

18. The crack status detection method according to claim 17, wherein in the short-circuit status test:
   the first reference voltage and the second reference voltage are enabled to be different;
   the plurality of switches are enabled to all be turned on in an initial time interval;
   the each of the plurality of switches is enabled to be cut off according to a second sequence that is opposite to the first sequence after the initial time interval; and
   the crack status of the integrated circuit is determined according to whether the current on the detection ring is less than a critical value.

19. The crack status detection method according to claim 12, wherein in an open-circuit status test:
   the first reference voltage and the second reference voltage are enabled to be different;
   the plurality of switches are enabled to all be turned on, and an open circuit is determined to occur at the detection ring when the current on the detection ring is detected to be less than a critical value.

20. The crack status detection method according to claim 19, wherein the open-circuit status test occurs before a short-circuit status test.

\* \* \* \* \*